US010127971B1

(12) United States Patent
Derner et al.

(10) Patent No.: US 10,127,971 B1
(45) Date of Patent: Nov. 13, 2018

(54) SYSTEMS AND METHODS FOR MEMORY CELL ARRAY INITIALIZATION

(71) Applicant: Micron Technology, Inc., Boise, ID (US)

(72) Inventors: Scott J. Derner, Boise, ID (US); Huy T. Vo, Boise, ID (US); Patrick Mullarkey, Meridian, ID (US); Jeffrey P. Wright, Boise, ID (US); Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/583,023

(22) Filed: May 1, 2017

(51) Int. Cl.
| | |
|---|---|
| G11C 11/4091 | (2006.01) |
| G11C 11/406 | (2006.01) |
| G11C 11/4072 | (2006.01) |
| G11C 11/4094 | (2006.01) |
| G11C 11/4096 | (2006.01) |

(52) U.S. Cl.
CPC ...... *G11C 11/4091* (2013.01); *G11C 11/4072* (2013.01); *G11C 11/4094* (2013.01); *G11C 11/4096* (2013.01); *G11C 11/40615* (2013.01)

(58) Field of Classification Search
CPC ............ G11C 11/401; G11C 11/40615; G11C 11/4072; G11C 11/4091; G11C 11/4094; G11C 11/4096
USPC ........................ 365/203, 189.011, 189.2, 222
See application file for complete search history.

(56) References Cited

U.S. PATENT DOCUMENTS

| | | | |
|---|---|---|---|
| 7,512,025 B2 | 3/2009 | Yoon et al. | |
| 9,147,461 B1* | 9/2015 | Youn ................ | G11C 7/1045 |
| 2004/0032781 A1 | 2/2004 | Cowles et al. | |
| 2009/0129176 A1 | 5/2009 | Vo et al. | |
| 2011/0141795 A1 | 6/2011 | Matsuzaki et al. | |
| 2012/0262996 A1* | 10/2012 | Akamatsu ........ | G11C 29/12015 |
| | | | 365/189.05 |
| 2012/0287739 A1* | 11/2012 | Chen ................. | G11C 11/40615 |
| | | | 365/203 |

(Continued)

OTHER PUBLICATIONS

Halderman, et al., "Lest We Remember: Cold Boot Attacks on Encryption Keys", Princeton University, USENIX Association, 17th USENIX Security Symposium, Jul. 2008.

(Continued)

*Primary Examiner* — Tha-O H Bui
*Assistant Examiner* — Alfredo Bermudez Lozada
(74) *Attorney, Agent, or Firm* — Dorsey & Whitney LLP

(57) ABSTRACT

Systems and methods are provided for implementing an array rest mode. An example system includes at least one mode register configured to enable an array reset mode, a memory cell array including one or more sense amplifiers, and control logic. Each of the one or more sense amplifier may include at least a first terminal coupled to a first bit line and a second terminal coupled to a second bit line. The control logic may be coupled to the memory cell array, and in communication with the at least one mode register. The control logic may be configured to drive, in response to array reset mode being enabled, each of the first and second terminals of the sense amplifier to a bit-line precharge voltage that corresponds to a bit value to be written to respective memory cells associated with each of the first and second bit lines.

15 Claims, 5 Drawing Sheets

(56) References Cited

U.S. PATENT DOCUMENTS

2015/0109841 A1    4/2015  Lim
2017/0018301 A1*   1/2017  Kilmer ................ G11C 11/4096

OTHER PUBLICATIONS

Sechadri, Vivek et al., "RowClone: Fast and Energy-Efficient In-DRAM Bulk Data Copy and Initialization", Micro-46 Proceedings of the 46th Annual IEEE/ACM Int'l Symposium on Microarchitecture, Dec. 2013, pp. 185-197.
International Search Report and Written Opinion dated Jul. 24, 2018 for PCT Application No. PCT/US2018/026763, 17 pages.
U.S. Appl. No. 16/105,889 titled "Systems and Methods for Memory Cell Array Initialization" filed Aug. 20, 2018.

* cited by examiner

SYSTEMS AND METHODS FOR MEMORY CELL ARRAY INITIALIZATION

BACKGROUND

Dynamic random access memory (DRAM) devices are volatile memory devices. Therefore, when power is removed from DRAM devices, the contents and operating configurations typically are not retained. Each time a DRAM device is powered up, a predefined sequence of steps is required to initialize the internal state machines of the DRAM device and to configure user-defined operating parameters.

Conventional main memory subsystems, however, rely on an external controller, such as a processor, to perform initialization operations. Accordingly, large amounts of data must typically be communicated back and forth between the controller and memory to perform initialization. Due to this arrangement, initialization causes high latency as large amounts of data are transferred over the memory bus, and furthermore consumes high amounts of bandwidth and power.

Thus, more efficient methods and apparatuses for implementing an array reset mode are desirable for DRAM initialization applications.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

The following detailed description illustrates a few exemplary embodiments in further detail to enable one of skill in the art to practice such embodiments. The described examples are provided for illustrative purposes and are not intended to limit the scope of the invention. In the following description, for the purposes of explanation, numerous specific details are set forth in order to provide a thorough understanding of the described embodiments. It will be apparent to one skilled in the art, however, that other embodiments of the present invention may be practiced without some of these specific details.

Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers herein used to express quantities, dimensions, and so forth, should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Figure 1:
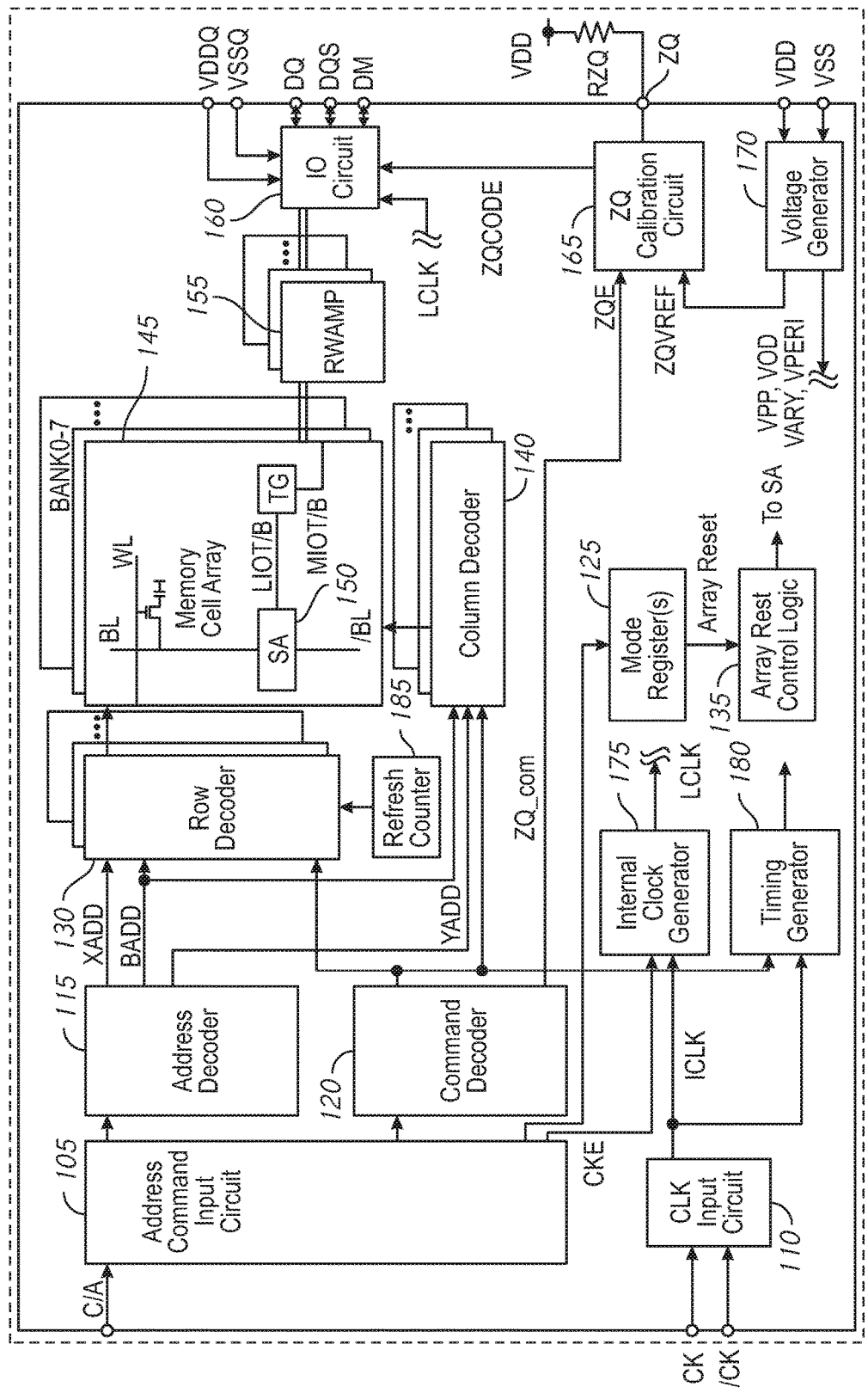
FIG. 1 is a schematic block diagram of a semiconductor device, in accordance with various embodiments.

FIG. 1 illustrates a schematic block diagram of a semiconductor device 100, in accordance with various embodiments. The semiconductor device 100 includes a memory die. The memory die may include an address/command input circuit 105, clock input circuit 110, address decoder 115, command decoder 120, mode registers 125, row decoder 130, array reset control logic 135, column decoder 140, memory cell array 145 including sense amplifiers 150, read/write amplifiers 155, I/O circuit 160, ZQ calibration circuit 165, voltage generator 170, internal clock generator 175, timing generator 180, and refresh counter 185.

In some embodiments, the semiconductor device 100 may include current and future generation DRAM devices, including, without limitation, DDR3 and DDR4 devices, for example. The die may be mounted on an external substrate, for example, a memory module substrate, a motherboard or the like. The semiconductor device 100 may further include a memory cell array 145. The memory cell array 145 includes a plurality of banks, BANK0-7, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 140. Sense amplifiers (SAs) 150 are located for their corresponding bit lines BL and connected to at least one respective local I/O line, which is in turn coupled to a respective one of at least two main I/O line pairs, via transfer gates (TG), which function as switches. Sense amplifiers 150 may include sense and amplify differential input voltages or currents. In semiconductor memory applications, sense amplifiers may be used to amplify differential input voltages or currents during read operations from memory cells, such as MC. Each of the sense amplifiers may be coupled to a BL pair configured to carry the input voltages or currents from the memory cells.

The semiconductor device 100 may employ a plurality f external terminals that include address and command terminals coupled to command/address bus (C/A), clock terminals CK and /CK, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the address/command input circuit 105, to an address decoder 115. The address decoder 115 receives the address signal and supplies a decoded row address signal to the row decoder 130, and a decoded column address signal to the column decoder 140.

The address decoder 115 also receives the bank address signal and supplies the bank address signal to the row decoder 130, the column decoder 140.

The command/address terminals may further be supplied with a command signal from outside, such as, for example, a memory controller. The command signal may be provided, via the C/A bus, to the command decoder 120 via the address/command input circuit 105. The command decoder 115 decodes the command signal to generate various internal commands that include a row command signal to select a word line and a column command signal, such as a read command or a write command, to select a bit line. In some embodiments, the command/address input circuit 105 may also receive a load mode register command. In alternative embodiments, the load mode register command may be issued to the command decoder 120. The load mode register command may cause one or more mode register(s) 125 to be loaded as indicated by the command, which will be discussed in greater detail below. Based on the status of the mode register(s) 125, array reset control logic 135 may cause the semiconductor device 100 to enter an array reset mode. During the array reset mode, the memory cell array 145 is reset, for example, memory cells of the memory cell array 145 may be set to a desired bit value, such as a logic high (1) or logic low (0). In some embodiments, this may include loading a separate mode register 125 that may be dedicated to array reset mode, or alternatively, may be implemented in other existing mode registers 125.

Figure 2:
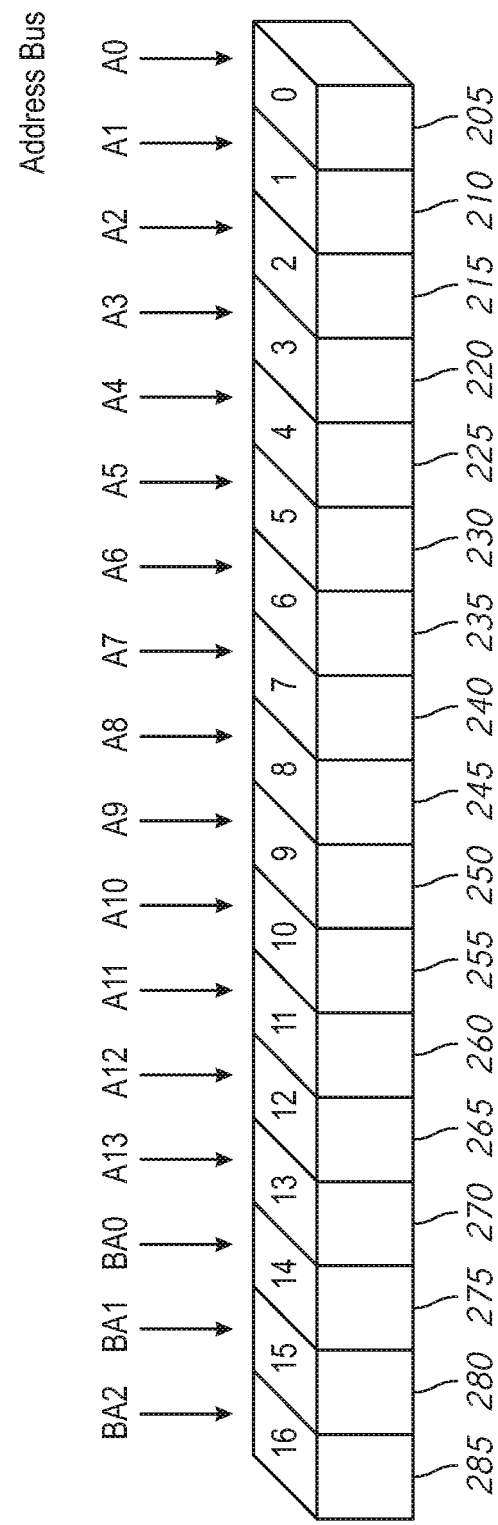
FIG. 2 is a schematic diagram of a mode register, in accordance with various embodiments.

For example, in some embodiments, as part of an initialization sequence, the device operating parameters are set. In some DRAM and SDRAM devices, the mode register(s) 125 may include two or more internal registers, such as a mode register (MR) and an extended mode register (EMR), or multiple mode registers (MR0, MR1, MR2, MR3, etc.). FIG. 2 illustrates a schematic diagram of a mode register 200, in accordance with various embodiments. In the embodiments depicted, the mode register 200 may be 17 bits long, each bit corresponding to respective bit positions M[16:0] 285-205. Thus, in some embodiments, the lowest significant bit may correspond to bit position M[0] 205, and the highest significant bit may correspond to bit may correspond to M[16] 285. The following description refers to both FIGS. 1 & 2 in describing the mode registers and load mode register operation. The load mode register command may be used to program the mode registers 200, 125. In some embodiments, the load mode register command may be issued concurrently with DRAM bank addresses BA[2:0], to select either the MR or EMR. The DRAM row addresses (A[13:0]) may provide the op-code to be written into the selected mode register 200, 125. The least significant row address A0 may correspond to the least significant bit M[0] 205 within the mode registers 200, 125. In some embodiments, the MR may have seven configurable bits that may be dynamically updated to reflect changing system requirements. These may include setting burst length, setting burst type, defining CAS latency, and performing delay-locked loop (DLL) reset. The EMR may include two configurable bits, A first bit may be used to enable the device DLL, and a second bit may be used to define output drive strength.

In other semiconductor devices 100, mode registers 200, 125 may include multiple mode registers, such as Mode Register 0 (MR0), Mode Register 1 (MR1), Mode Register 2 (MR2), and Mode Register 3 (MR3). In some embodiments, mode registers may be loaded following a predefined sequence during initialization. For example, in some embodiments, MR2 may be loaded, followed by MR3, MR1, and MR0. In some embodiments, mode registers may be identified via bits M[15:14] 280, 275, and loaded via bank addresses BA[1:0].

MR0 may be a base register, for example, for a DDR3 device. The mode register MR0 may have similar functionality mode register MR, as previously discussed. Thus, MR0 may be used to define burst length, READ burst type, CAS latency, DLL reset, write recovery, and precharge power-down. In some embodiments, during initialization, the DLL is enabled utilizing MR1 prior to performing a DLL reset in MR0. In some embodiments, MR1 may be used to enable or disable DLL, adjust output drive strength, define CAS additive latency, set write leveling, set Rtt_nom value for on-die terminations (ODT), set termination data strobe (TDQS), and for output disable (Q off). During initialization, it is necessary to perform ZQ calibration to obtain tight tolerances of the output drive impedance and Rtt_nom values selected in MR1.

In some embodiments, MR2 may be used to set CAS write latency, auto self-refresh, self-refresh temperature, and dynamic ODT. MR3 may be used to output predefined system timing calibration bit sequences.

During normal operation, when a read command is issued and a row address and a column address are timely supplied with the read command, read data is read from a memory cell in the memory cell array 145 designated by these row address and column address. The read data DQ is output to outside from the data terminals DQ, DQS, and DM via read/write amplifiers 155 and an I/O circuit 160. Similarly, when a write command is issued and a row address and a column address are timely supplied with this command, and then write data is supplied to the data terminals DQ, DQS, DM, the write data is received by data receivers in the input/output circuit 160. Then the write data is supplied via the input/output circuit 160 and the read/write amplifiers 155 to the memory cell array 145 and written in the memory cell designated by the row address and the column address.

Turning to the explanation of the external terminals included in the semiconductor device 100, the clock terminals CK and /CK are supplied with an external clock signal and a complementary external clock signal, respectively. The external clock signals (including complementary external clock signal) may be supplied to a clock input circuit 110. The clock input circuit 110 may receive the external clock signals to generate an internal clock signal ICLK. The internal clock signal ICLK is supplied to an internal clock generator 175 and thus a phase controlled internal clock signal LCLK is generated based on the received internal clock signal ICLK and a clock enable signal CKE from the address/command input circuit 105. Although not limited thereto, a DLL circuit can be used as the internal clock generator 175. The phase controlled internal clock signal LCLK is supplied to the input/output circuit 160 and is used as a timing signal for determining an output timing of read data. The internal clock signal ICLK is also supplied to a timing generator 180 and thus various internal clock signals can be generated and supplied to the respected circuits including an array reset control logic circuit 135, which will be described later in detail.

The power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI, and the like and a reference potential ZQVREF based on the power supply potentials VDD and VSS. The internal potential VPP is mainly used in the row decoder 140, the internal potentials VOD and VARY are mainly used in the sense amplifiers included in the memory array 150, and the internal potential VPERI is used in many other circuit blocks. The reference potential ZQVREF is used in the ZQ calibration circuit 165. The power supply potentials and the internal potentials are supplied to the circuit 135.

The power supply terminals are also supplied with power supply potentials VDDQ and VSSQ. These power supply potentials VDDQ and VSSQ are supplied to the input/output circuit 160. The power supply potentials VDDQ and VSSQ are the same potentials as the power supply potentials VDD and VSS, respectively. However, the dedicated power supply potentials VDDQ and VSSQ are used for the input/output circuit 160 so that power supply noise generated by the input/output circuit 160 does not propagate to the other circuit blocks.

The calibration terminal ZQ is connected to the ZQ calibration circuit 165. The ZQ calibration circuit 165 performs a calibration operation with reference to an impedance of RZQ, and the reference potential ZQVREF, when activated by the ZQ calibration command signal (ZQ_com). An impedance code ZQCODE obtained by the calibration operation is supplied to the input/output circuit 160, and thus an impedance of an output buffer (not shown) included in the input/output circuit 160 is specified.

As previously discussed, an array reset mode may be used to reset the memory cell array 145, for example, to reset memory cells of the memory cell array 145 to a desired potential (i.e., logic high (1) or logic low (0)). To enter array reset mode, the command decoder 120 may receive an array reset mode command, for example, during initialization or responsive to input for a user to enter array reset mode. The command decoder 120 decodes the array reset mode command and generates various internal commands to carry out an array reset mode operation. In some embodiments, the array reset mode command may include, first, a PRECHARGE command. The PRECHARGE command may be used to deactivate an open row in a particular bank, or in this case, all banks. The banks may be available for subsequent row access in a specified time after the PRECHARGE command is issued. After a bank is precharged, it is in an idle state.

Next, the command decoder 120 may load the mode registers in response to the array reset command, which may include a load mode register command. When the mode register(s) 125 are set to enable an array reset mode, array reset control logic 135 may be activated by a signal Array Reset and thus cause the semiconductor device 100 to enter the array reset mode. In some embodiments, array reset control logic 135 may include portions of the mode register(s) 125 responsible for causing the semiconductor device 100 to enter array reset mode. In other embodiments, the array reset control logic 135 may include a separate chip or device for controlling array reset operations.

Figure 3:
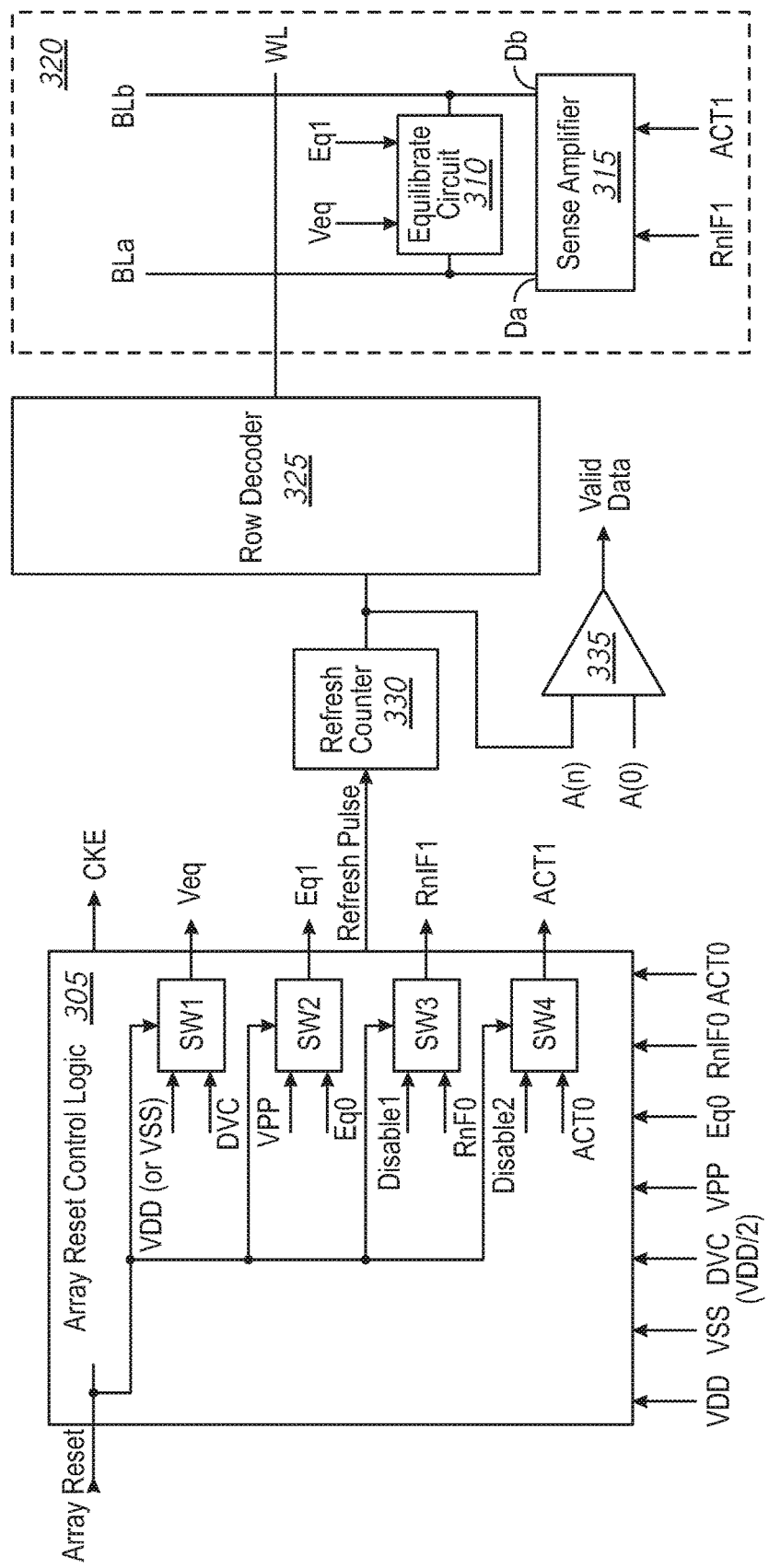
FIG. 3 is a schematic block diagram of an array reset circuit in a semiconductor device, in accordance with various embodiments.

Responsive to enabling array reset mode, the array reset control logic 135 may be configured to cause all bit lines of an array to be set to a voltage corresponding to a desired bit value, such as a logic high (1) or logic low (0) as will be discussed in greater detail below with respect to FIGS. 3 & 4. In some embodiments, the bit line voltage in array reset mode may be set to the supply voltage, VDD, or ground, VSS. In some embodiments, settling time to force all bit lines to logic low may be on the order of 1 ms, with a peak supply current of less than 50 mA. Once the load mode register command is issued, typically the clock enable signal (CKE) must be held low for approximately 8-16 clock cycles. For example, in some embodiments, CKE must be held low for at least 10 ms prior to the array reset signal being asserted.

Once all bit lines are driven to a voltage corresponding to the desired bit value, an internal self-refresh pulse may be generated by array reset control logic 135 to refresh counter 185 to start internal self-refresh operations. Concurrently, the refresh counter 185 may be reset and updated each time the internal self-refresh pulse is generated. Thus, the internal self-refresh pulse may be generated periodically to refresh each row of the memory cell array 145. In self-refresh mode, the refresh counter 185 may activate a particular row address as a refresh operation. Thus, the rows corresponding to a given row address may be activated for each of the memory cell arrays 145. Once the row has been activated, a refresh counter 185 may be utilized to generate a subsequent row address for activation. Thus, each time a row is activated via self-refresh, because all bit lines of each array are driven to the desired bit value, the desired bit values may be written to the memory cells corresponding to each bit line of each respective row when it is activated. In some embodiments, all bit lines may be held at logic low, while in other embodiments, all bit lines may be held at logic high. In further embodiments, a pattern or other sequence of bits may be written to the memory cell array 145.

At the time when the first row is refreshed, a valid data register bit may be set by a refresh counter comparator (which will be described with reference to FIG. 3). This may indicate that the data in the memory cell arrays 145 has not yet fully been initialized. Eventually, after all rows have been refreshed, the refresh counter 185 will wrap around and provide the row address of the first row that was refreshed. When this happens, the refresh counter comparator may be configured to reset the valid data register, indicating that all rows of each of the memory cell arrays 145 have been initialized and set to the desired bit value. When this occurs, CKE may be set to high. The array reset control logic 135 may wait a lens settling duration for bit line voltages to return to a nominal precharge voltage level.

Details of array reset mode operation will now be described with reference to FIG. 3. FIG. 3 is a schematic block diagram of an array reset circuit 300 of a semiconductor device, in accordance with various embodiments. In some embodiments, the array reset circuit 300 may include all or part of the array reset control logic 135 of FIG. 1. In further embodiments, the array reset control logic 305 may correspond to array reset control logic 135 of FIG. 1. The array reset circuit 300 includes array reset control logic 305, memory cell array 320 having sense amplifier 315, and equilibrate (or equalizing) circuit 310, row decoder 325, refresh counter 330, and refresh counter comparator 335. With respect to FIG. 1, the refresh counter 330 may correspond to refresh counter 185, row decoder 325 may correspond to row decoder 130, and memory cell array 320 may correspond to memory cell array 145.

The array reset control logic 305 may receive Array Reset signal as well as power voltages VDD, VSS and VPP that have been described with reference to FIG. 1. The array reset control logic 305 may further receive a precharge voltage DVC, that is a half of VDD (VDD/2), generated by the voltage generator 170 (FIG. 1) in normal data read and write operations. The array reset control logic 305 may still further receive timing signals Eq0, RnIF0 and ACT0, which may be generated by the timing generator 180 in the normal data read and write operations. The timing signal Eq1 may be used to control activation and deactivation of the circuit 301, and the timing signals RnIF0 and ACT0 may be used to control enablement and disablement of the sense amplifier 315. The array reset control logic 305 may include four switch circuits SW1 to SW4. In the array reset mode (that is, when the Array Reset signal takes an active level), the SW1 to SW4 are configured to be switched over to select VDD (or GRID) level, VPP level, a Disable1 level and a Disabel2 level, respectively. The Disable1 and Disable 2 levels may take VDD or VSS according to reset data to be written into each memory cell during array reset operation. In the normal operation modes (that is, when the Array Reset signal takes an inactive level), on the other hand, the SW1 to SW4 are configured to be switched over to select DVC level, Eq0 signal, RnIF0 signal and ACT0 signal, respectively. The outputs Veq and Eq1 from the SW1 and SW2 are supplied to the equilibrate circuit 301, and the outputs of the SW3 and SW4 are supplied to sense amplifier 315.

In operation, sense (or input/output) terminals Da and Db of the sense amplifier 315 are precharged and equilibrated to a precharge voltage Veq of the DVC level in preparation for a memory operation, for example, a read, a write, or precharge operation. The terminals Da and Db may be precharged to the precharge voltage. The terminals Da and Db may also be equilibrated to have the same voltage by activating the equilibrate circuit 310. The sense amplifier 315 is configured to detect a voltage difference at the terminals Da and Db and amplify the difference by driving the terminals Da and Db to complementary voltages (e.g., VDD and ground). A voltage difference is created on the terminals Da and Db by coupling a selected memory cell to one of the bit lines BLa or BLb, which are coupled to the terminals Da and Db, respectively. During a read operation, the complementary voltages corresponding to data stored in the selected memory cell are provided to input/output lines of the memory cell array 320 (not shown in FIG. 3) by the sense amplifier 315. During a write operation, following the amplification of the voltage difference on terminals Da and Db, the sense amplifier 315 drives the terminals Da and Db to voltages corresponding to the data to be written to a memory cell. For example, a memory cell coupled to bit line BLa, and consequently, coupled to the terminal Da, is written by the sense amplifier 315 by driving the terminal Da to the voltage corresponding to the data to be written to the memory cell (VDD to write a "1" and ground to write a "0"). The bit line BLb is driven by the sense amplifier 315 to the complementary voltage.

When the array reset signal is asserted with activating the Array Reset signal, for example through loading the mode register(s), the array reset control logic 305 may change the output Eq1 to the VPP level with outputting the VDD level as Veq. The array reset control logic 305 may further bring the outputs RnIF1 and ACT1 into the Disable1 and Disable2 levels, respectively. Thus, the equilibrate circuit 310 is activated to set the sense terminals Da and Db of the sense amplifier 315 (and thus the bit lines BLa and BLb) to the VDD level, whereas the sense amplifier 315 is deactivated. It is to be understood that the sense terminals Da and Db of the sense amplifier 315 (and thus the bit lines BLa and BLb) may be set to the ground, VSS level in place of the VDD level in the array reset mode. Although a single sense amplifier, equilibrate circuit, and bit line pair are depicted for purposes explanation, it is to be further understood that memory cell array 320 may include one or more sense amplifiers 315 and equilibrate circuits 310 associated with one or more bit lines, respectively.

The communication between the equilibrate circuit 310 and the sense amplifier 315 will be described in more detail below with respect to FIG. 4.

Once all bit lines are driven to a voltage corresponding to the desired bit value (VDD or VSS, for example), an internal self-refresh pulse (Refresh Pulse) may be generated by, for example, the array reset control logic 305 to start internal self-refresh operations, and the refresh counter 330 may be reset. In self-refresh mode, the rows (WL) of the memory cell array 320 may be activated sequentially, by row addresses, as provided by the refresh counter 330 to the row decoder 325. The row decoder 325 may be configured to decode the row address provided by the refresh counter 330 to output a row selection signal corresponding to a physical row of the memory cell array 320 to be activated. Thus, the corresponding row of each the memory cell array 320 may be activated. When the row has been activated, refresh counter 330 may be incremented to generate a subsequent row address for activation. Thus, each time a row is activated via self-refresh, the desired bit values may be written to the memory cells corresponding to each bit line of each respective row when it is activated.

At the time when the first row is refreshed, a valid data register bit may be set by a refresh counter comparator 335. The refresh address comparator 335 may utilize a first row address, A(0), to first set the valid data register. This may indicate that the data in the memory cell arrays 145 has not yet fully been initialized. When the refresh counter 330 wraps around to output the first row address again, it is an indication that all rows of the memory cell array 320 have been refreshed. When this occurs, the refresh counter comparator 335 may be configured to reset the valid data register, indicating that all rows of each of the memory cell arrays 320 have been initialized and set to the desired bit value. When this occurs, CKE may be set to high, indicating normal operation may take place. The array reset control logic 305 may wait a 1 ms settling duration for bit line voltages to return to a nominal precharge voltage level.

Figure 4:
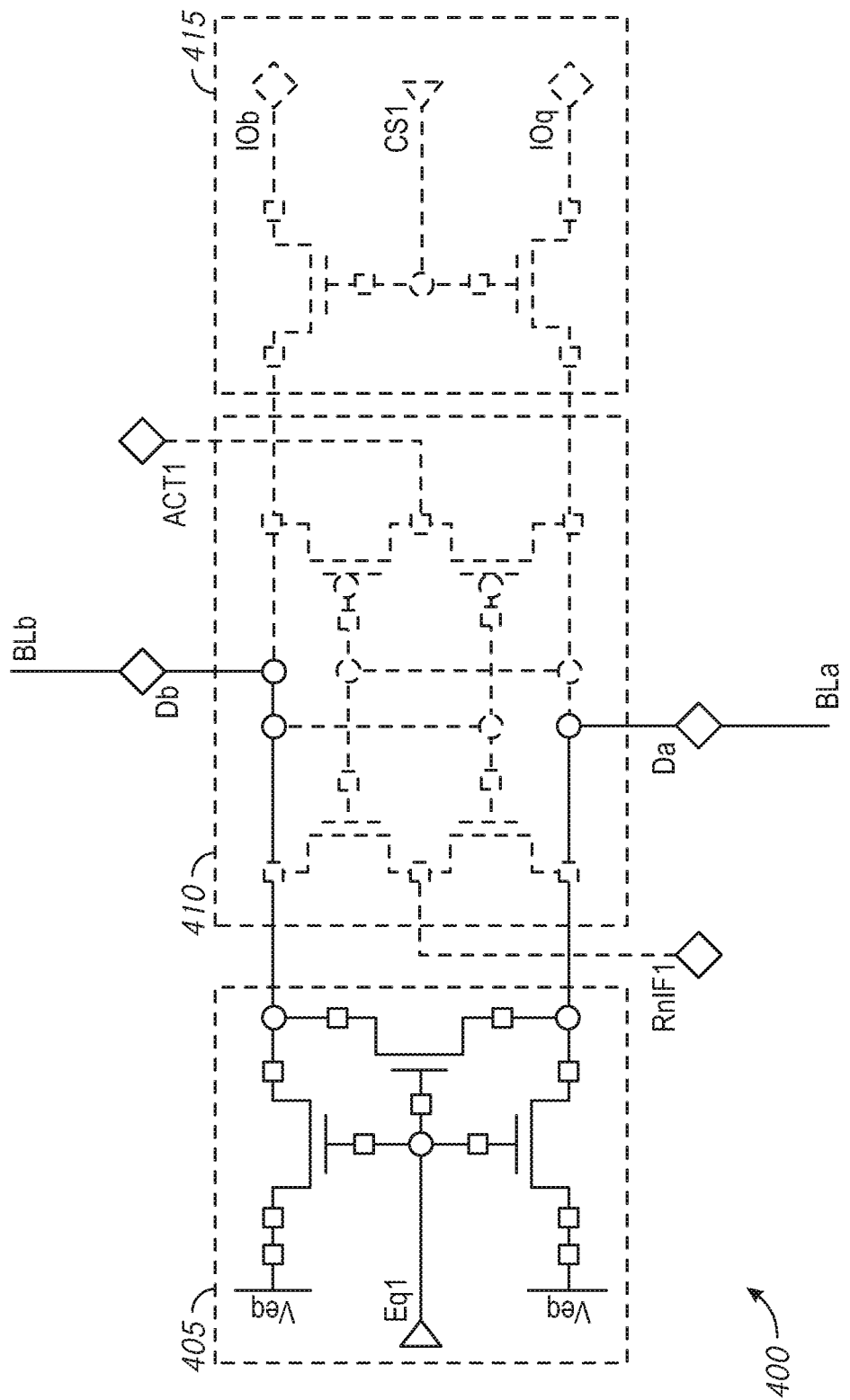
FIG. 4 is a circuit diagram of an array reset circuit, in accordance with various embodiments.

FIG. 4 is a circuit diagram of an array reset circuit 400, in accordance with various embodiments. In some embodiments, the array reset circuit 400 may include equilibrate circuit 405, sense amplifier 410, and I/O path 415 for read/write operation. During array reset mode, the I/O path 415 may be deactivated by changing a signal CS1 to the low level, because the I/O path 415 includes two N-channel transistors. Although not shown in FIG. 3, the array reset control logic 305 may further receive an original signal CS that is used to control activation and deactivation of the T/O path 415, and further include a fifth SW circuit that is controlled by the Array Reset signal to switch its output CS1 between the original signal CS and the low level according to the operation modes, array reset mode and normal operation mode. Terminal Da may be coupled to a first bit line, for example, bit line BLa, while terminal Db may be coupled to a second bit line, for example, bit line BLb.

Conventionally, when a refresh operation is performed, the same value that was initially stored in a memory cell may be written back to the memory cell. In order to accurately read a bit value stored in a memory cell to be written back, complementary bit lines coupled to Da and Db must be precharged and equilibrated prior to reading the stored bit value. Da and Db may be precharged by driving the Veq line to a supply voltage of DVC2, or roughly half of the operating voltage VDD, and Da and Db may be equilibrated to have the same voltage by coupling Da and Db together. However, in some embodiments, instead of precharging Da and Db at DVC2, by driving the Veq line to the reset level (VDD or VSS), the array reset control logic 205 may cause voltages provided to Da and Db to the reset level. Thus, when a row is refreshed, the bit value associated with the reset level may be written to the respective memory cell, regardless of the bit value previously stored by the memory cell.

In some embodiments, the equilibrate circuit 405 may include a first transistor having a first source coupled to the bit line BLa associated with Da, a first drain coupled to Veq, and a first gate. The equilibrate circuit 405 may include a second transistor having a second source coupled to Veq, a second drain coupled to the bit line BLb associated with Db, and a second gate. The equilibrate circuit 405 may further include a third transistor, having a third source (or drain) coupled to the second drain, a third drain (or source) coupled to the first source, and a third gate. Each of the first, second and third gates may be tied together to receive the Eq1 signal. In some embodiments, each of these transistors may be of N-channel type. Thus, when the Eq1 signal is asserted, a short circuit is formed between Da and Db, equilibrating the signals provided to each of the respective bit lines BLa and BLb associated with Da and Db. In particular, as the Eq1 signal takes the VPP level in the array reset mode, the respective bit lines BLa and BLb associated with Da and Db may be set to the VDD level.

In some embodiments, the sense amplifier 410 may include two N-channel transistors and two P-channel transistors that are cross-coupled to form a flip-flop circuit. In the array reset mode, therefore, the RnIF1 and ACT1 signals are brought respectively into Disable1 and Disable2 levels to deactivate the sense amplifier 410.

Figure 5:
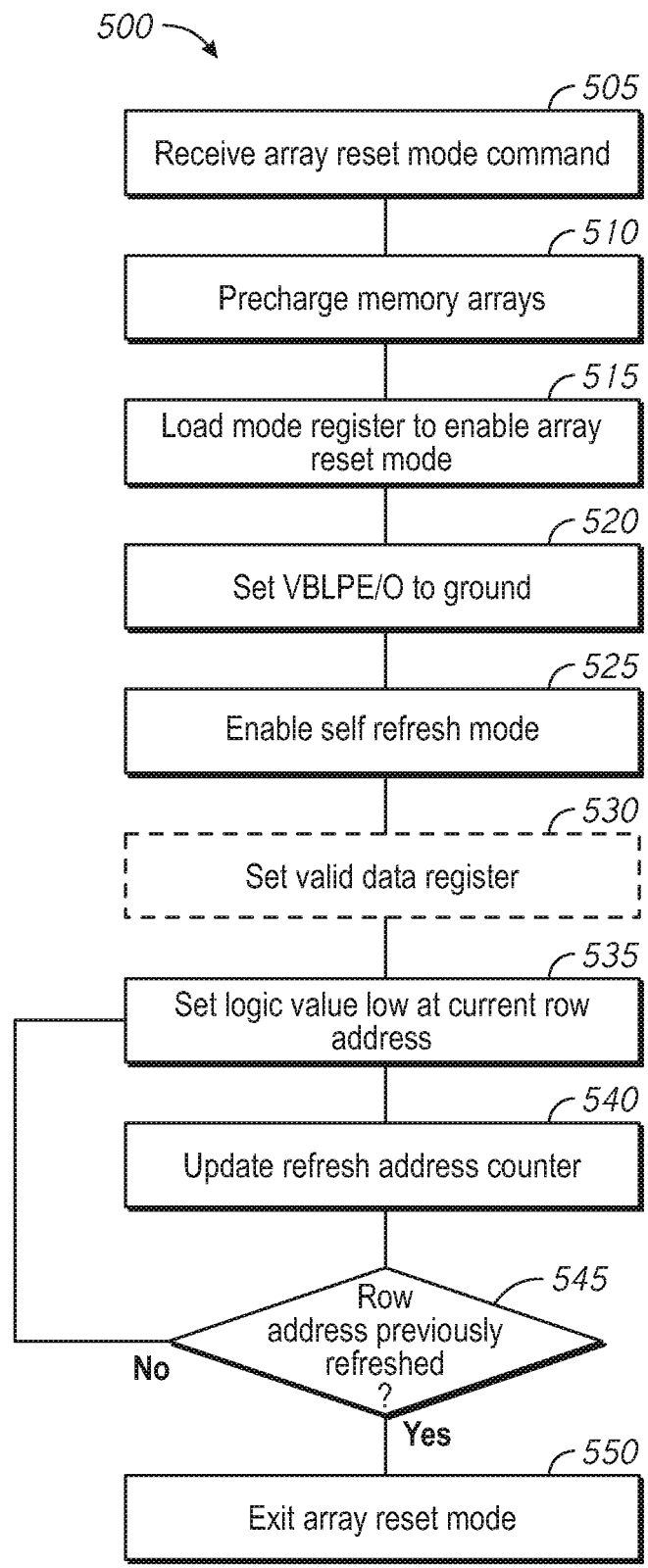
FIG. 5 is a flow diagram of a method of implementing array reset mode operation, in accordance with various embodiments.

FIG. 5 is a flow diagram of a method 500 of implementing array reset mode operation, in accordance with various embodiments. The method 500 begins, at block 505, by receiving an Array Reset Mode command. In some embodiments, the Array Reset Mode command may be issued by a controller responsive to power-up and initialization, or in response to a user command.

At block 510, the Array Reset Mode command may cause a precharge command to be issued. In some embodiments, the precharge command may be subsequently issued, separate from the Array Reset mode command, while in other embodiments, precharging of the memory cell array may occur without needing a separate precharge command to be issued.

At block 515, a load mode register command is issued to enable the Array Reset mode. In some embodiments, in response to the mode registers being loaded, at block 520, VBLPE/O may be set to ground. Although the method 500 is described as setting VBLPE/O to ground, this should not be taken as limiting. It is to be understood that in other embodiments, other voltages may be utilized. Voltages may be selected based on a desired bit value to be stored in a respective memory cell. Thus, by precharging bit lines at voltages greater than or less than half of VDD (DVC2), the desired bit value may be stored in the respective memory cells.

At block 525, self-refresh mode is enabled. By precharging every bit line to the desired VBLPE/O, when a row is activated for refresh operation, a bit value corresponding to the VBLPE/O may be written to each memory cell of an activated row. By enabling a self-refresh row, a refresh counter may be utilized to cycle through each row of a memory cell array until all rows of each array have been activated, resetting the memory cell array to hold the desired bit values in each memory cell.

In some embodiments, at optional block 530, a refresh counter comparator may be used to set a valid data register. The valid data register may indicate when reset mode operations are still ongoing, and when they have been completed. When a first row address is activated during self-refresh, the set valid data register may be set.

At block 535, the bit value may be set to a logic value low at the current row address. This may be accomplished by activating the row address for refresh operation. However, because the bit-lines are held at the Vey level that is VSS or VDD, a bit value corresponding to VSS or VDD may be written to each of the memory cells of the activated row. In this case, the bit value may correspond to a logic low (VSS). Although the embodiment is described as setting the bit value to a logic low, this should not be taken as limiting. It will be appreciated by those skilled in the art that in other embodiments, the bit value may similarly be set to logic high by adjusting the Veq level to a voltage corresponding to logic high (VDD).

At block 540, once the row has been refreshed, the refresh address counter is updated to provide the next row address. As the refresh counter cycles through row addresses, when all row addresses have been refreshed, the refresh counter may wrap around back to the first row address. Thus, at decision block 545, it is determined whether the row address has been previously refreshed. In some embodiments, this may be determined via a refresh counter comparator, as previously described. If the row address has not been previously refreshed, the method 400 continues, at block 535, by activating the current row address indicated by refresh counter. Again, as described above, the bit value may be set corresponding to VBLPE/O, which in the depicted embodiment, corresponds to a logic low.

However, if the row address is determined to have been previously refreshed, at block 450, array reset mode is exited. In some embodiments, exiting array reset mode may include resetting the valid data register to indicate all rows have been reset with desired bit value. In some embodiments, the time to refresh all rows, and correspondingly resetting all memory cells, may be calculated as the period of the internal self-refresh pulse (as previously described), times the number of rows to be refreshed, plus the settling time. Thus, in one embodiment, the time to reset all memory cells in an array may be approximately 3.87 ms, based on a period of the internal self-refresh pulse being 350 ns, times the number of rows in a 8G device (8192 rows), plus a settling time of 1 ms. The settling time may be the amount of time that must be waited before resuming normal operations. This may allow Veq to be set to the DVC, a half of VDD, and for bit lines to return to the DVC. The mode registers associated with array reset mode may also be reset, and the CKE signal set to high.

While certain features and aspects have been described with respect to exemplary embodiments, one skilled in the art will recognize that various modifications and additions can be made to the embodiments discussed without departing from the scope of the invention. Although the embodiments described above refer to particular features, the scope of this invention also includes embodiments having different combination of features and embodiments that do not include all of the above described features. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, various procedures may be reordered, added, and/or omitted in accordance with various embodiments. The procedures described with respect to one method or process may be incorporated within other described methods or processes; likewise, hardware components described according to a particular structural architecture and/or with respect to one system may be organized in alternative structural architectures and/or incorporated within other described systems. Hence, while various embodiments are described with or without certain features for ease of description, the various components and/or features described herein with respect to a particular embodiment can be combined, substituted, added, and/or subtracted from among other described embodiments. Consequently, although several exemplary embodiments are described above, it will be appreciated that the invention is intended to cover all modifications and equivalents within the scope of the following claims.

What is claimed is:

1. An apparatus comprising:
    at least one mode register configured to enable an array reset mode;
    a memory cell array including one or more sense amplifiers, each of the one or more sense amplifier including at least a first terminal coupled to a first bit line and a second terminal coupled to a second bit line;
    control logic coupled to the memory cell array, and in communication with the at least one mode register, the control logic configured to:
        drive, in response to array reset mode being enabled, each of the first and second terminals of the sense amplifier to a bit-line precharge voltage, wherein the bit-line precharge voltage corresponds to a bit value to be written to respective memory cells associated with each of the first and second bit lines,
        wherein the at least one mode register is further configured to enable a self-refresh mode, wherein the control logic is further configured to generate, in response to self-refresh mode being enabled, an internal self-refresh pulse internally, wherein the internal self-refresh pulse causes a current row address of the memory cell array to be activated; and
    a refresh counter comparator, wherein the at least one mode register further comprises a valid data register, and wherein the refresh counter comparator is configured to set, at a first row address of the refresh counter, the valid data register to a first state indicating that all memory cells of the memory cell array have not been reset, and wherein when the refresh counter outputs the first row address a second time, resetting the valid data register to a second state indicating that all memory cells of the memory cell array have been reset.

2. The apparatus of claim 1 further comprising a refresh counter, wherein the refresh counter is configured to update the current row address to a subsequent row address each time the internal self-refresh pulse is generated.

3. The apparatus of claim 1, wherein the bit value associated with the bit-line precharge voltage is written to the respective memory cells of the current row address associated with each of the first or second bit lines.

4. The apparatus of claim 1, wherein the bit-line precharge voltage is one of supply voltage or ground.

5. The apparatus of claim 1, wherein the sense amplifier further comprises an equilibrate circuit configured to equilibrate signals on the first terminal and second terminal, wherein the control logic is further configured to enable the equilibrate circuit responsive to the first and second terminals being driven to the bit-line precharge voltage.

6. The apparatus of claim 1, wherein once all memory cells of the memory cell array have been written with the bit value associated with the bit-line precharge voltage; the control logic is configured to disable the bit-line precharge voltage to allow the first and second terminal to return to a nominal bit-line voltage.

7. The apparatus of claim 1, wherein the same bit values are written to the respective memory cells associated with the first and second bit lines.

8. An apparatus comprising:
    control logic configured to:
        receive an array reset mode command;
        drive, in response to receiving the array reset mode command, each of a first terminal and a second terminal of a sense amplifier to a bit-line precharge voltage, wherein the first terminal is coupled to a first bit-line and the second terminal is coupled to a second bit-line, wherein the bit-line precharge voltage corresponds to a bit value to be written to respective memory cells associated with each of the first and second bit lines;
        generate, in response to receiving the array reset mode command, an internal self-refresh pulse periodically;
        activate a current row address indicated by a refresh counter, wherein by activating the current row address, the bit value associated with the bit-line precharge voltage is written to the respective memory cells associated with each of the first and second bit lines at the current row address;
        update the current row address of the refresh counter to a subsequent address;
        set a valid data register, at a first row address of the refresh counter, to a first state indicating all memory cells of the memory cell array have not been reset; and
        set the valid data register, when the refresh counter outputs the first row address a second time, to a second state indicating that all memory cells of the memory cell array have been reset.

9. The apparatus of claim 8, wherein the control logic is further configured to:
    load, in response to receiving the array reset mode command, a mode register, wherein the mode register is configured to enable a bit-line precharge voltage to be applied to the first and second terminals, and to enable an internal self-refresh mode.

10. The apparatus of claim 8, wherein the bit-line precharge voltage is one of supply voltage or ground.

11. The apparatus of claim 8, wherein the control logic is further configured to:
    equilibrate signals on the first terminal and second terminal responsive to the first and second terminals being driven to the bit-line precharge voltage.

12. The apparatus of claim 1, wherein once all memory cells of the memory cell array have been written with the bit value associated with the bit-line precharge voltage, the control logic is further configured to disable the bit-line precharge voltage to allow the first and second terminal to return to a nominal bit-line voltage.

13. A method comprising:
receiving an array reset mode command;
enabling an array reset mode responsive, at least in part, to receiving the array reset mode command, wherein enabling an array reset mode comprises at least:
  enabling a bit-line precharge voltage;
  driving a first terminal of a sense amplifier to the bit-line precharge voltage, wherein the first terminal is coupled to a first bit-line;
  driving a second terminal of the sense amplifier to the bit-line precharge voltage, wherein the second terminal is coupled to a second bit-line;
generating a self-refresh pulse;
activating, in response to the self-refresh pulse, a current row address indicated by a refresh counter;
writing a bit value corresponding to the bit-line precharge voltage to respective memory cells associated with at least one of the first and second bit lines at the current row address; and
updating the refresh counter to output a subsequent row address;
setting a valid data register to a first state indicating that all memory cells of a memory cell array have not been reset; and
setting the valid data register to a second state indicating that all memory cells of the memory cell array have been reset.

14. An apparatus comprising:
at least one mode register configured to enable an array reset mode;
a memory cell array including one or more sense amplifiers, each of the one or more sense amplifier including at least a first terminal coupled to a first bit line and a second terminal coupled to a second bit line;
control logic coupled to the memory cell array, and in communication with the at least one mode register, the control logic configured to:
  drive, in response to array reset mode being enabled, each of the first and second terminals of the sense amplifier to a bit-line precharge voltage, wherein the bit-line precharge voltage corresponds to a bit value to be written to respective memory cells associated with each of the first and second bit lines,
wherein once all memory cells of the memory cell array have been written with the bit value associated with the bit-line precharge voltage, the control logic is configured to disable the bit-line precharge voltage to allow the first and second terminal to return to a nominal bit-line voltage.

15. An apparatus comprising:
at least one mode register configured to enable an array reset mode;
a memory cell array including one or more sense amplifiers, each of the one or more sense amplifier including at least a first terminal coupled to a first bit line and a second terminal coupled to a second bit line; and
control logic coupled to the memory cell array, and in communication with the at least one mode register, the control logic configured to drive, in response to array reset mode being enabled, each of the first and second terminals of the sense amplifier to a bit-line precharge voltage, wherein the bit-line precharge voltage corresponds to a bit value to be written to respective memory cells associated with each of the first and second bit lines,
wherein once all memory cells of the memory cell array have been written with the bit value associated with the bit-line precharge voltage, the control logic is further configured to disable the bit-line precharge voltage to allow the first and second terminal to return to a nominal bit-line voltage.

* * * * *